(12) United States Patent
Zhang et al.

(10) Patent No.: US 9,697,315 B2
(45) Date of Patent: Jul. 4, 2017

(54) SYSTEM AND METHOD FOR DISPLAYING A DEVICE USING AN AUTOMATED TOOL

(71) Applicant: Taiwan Semiconductor Manufacturing Co., Ltd., Hsin-Chu (TW)

(72) Inventors: Ya-Min Zhang, Shanghai (CN); Peng-Sheng Chen, Shanghai (CN); Mu-Jen Huang, Taipei (TW); Ming Feng, Shanghai (CN)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/501,174

(22) Filed: Sep. 30, 2014

(65) Prior Publication Data
US 2016/0034623 A1 Feb. 4, 2016

(30) Foreign Application Priority Data
Aug. 1, 2014 (CN) .......................... 2014 1 0377187

(51) Int. Cl.
*G06F 17/50* (2006.01)

(52) U.S. Cl.
CPC ...... *G06F 17/5063* (2013.01); *G06F 17/5068* (2013.01); *G06F 17/5081* (2013.01)

(58) Field of Classification Search
USPC .................. 716/110, 111, 112, 116, 54, 55
See application file for complete search history.

(56) References Cited

U.S. PATENT DOCUMENTS

| 6,321,367 | B1 | 11/2001 | Chun et al. | |
|---|---|---|---|---|
| 2004/0088660 | A1* | 5/2004 | Tran | G06F 17/5068 716/119 |
| 2005/0086621 | A1* | 4/2005 | Matsumura | G06F 17/5045 716/102 |
| 2007/0234262 | A1* | 10/2007 | Uedi | G06F 17/5081 716/52 |
| 2011/0088006 | A1* | 4/2011 | Kojima | G06F 17/5081 716/112 |
| 2012/0121160 | A1* | 5/2012 | Matsuoka | H01J 37/28 382/145 |
| 2013/0305202 | A1* | 11/2013 | Shroff | G06F 17/5068 716/112 |
| 2014/0223391 | A1* | 8/2014 | Fu | G03F 1/70 716/52 |

OTHER PUBLICATIONS

Laker3™ Custom Design Tools, 2014 Synopsis, Inc., 12 pages.

* cited by examiner

*Primary Examiner* — Brian Ngo
(74) *Attorney, Agent, or Firm* — Duane Morris LLP

(57) ABSTRACT

A method comprises receiving, in a computer, an input indicative of a drawing of at least a portion of at least one layer of a semiconductor device. The at least one portion of the at least one layer is compared to corresponding portions in corresponding layers of a plurality of previously defined devices stored in a non-transitory machine readable storage medium. Each layer of at least one of the plurality of previously defined devices for which the corresponding portion in the corresponding layer matches the at least one portion of the at least one layer of the semiconductor device is displayed on a display device.

20 Claims, 14 Drawing Sheets

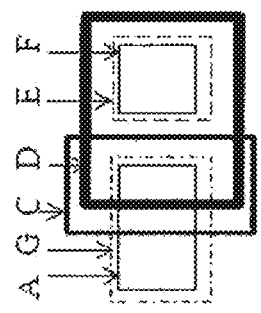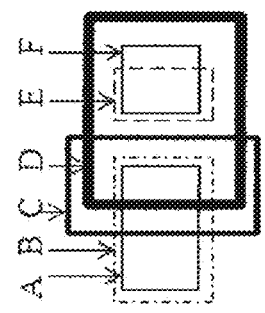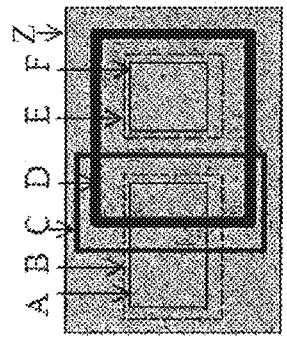
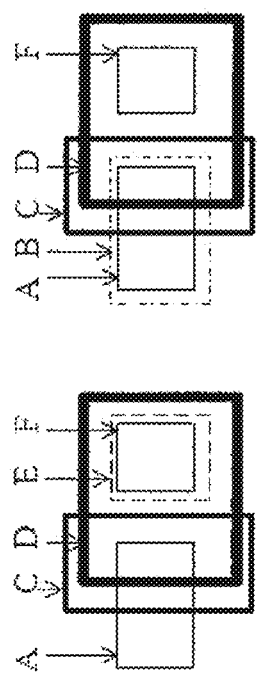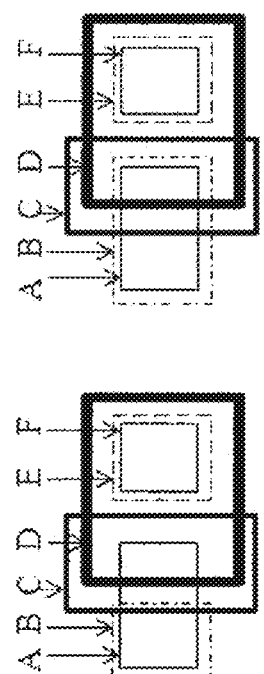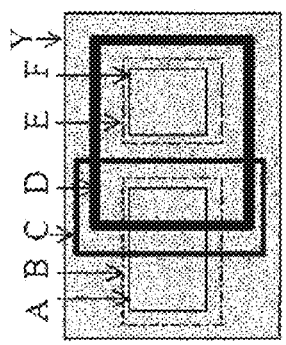
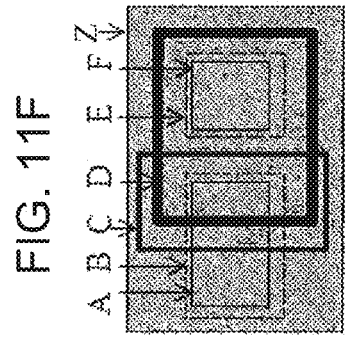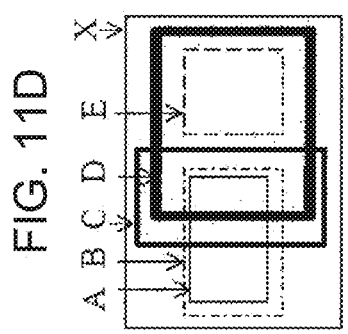

SYSTEM AND METHOD FOR DISPLAYING A DEVICE USING AN AUTOMATED TOOL

PRIORITY CLAIM AND CROSS-REFERENCE

None.

BACKGROUND

This disclosure relates to electronic design automation tools. Designers use automated electronic design automation (EDA) tools to rapidly and efficiently design devices, functions and integrated circuits (ICs). An example of such a tool is the "LAKER3™" custom design tools suite by Synopsys of Mountain View, Calif.

The efficiency of designing new ICs is greatly enhanced by the user of reusable standard cells for devices such as transistors and diodes. If a designer wishes to modify a previously designed device in a device library, the designer inputs the name of the device into the EDA tool. Using the name, the EDA tool can retrieve the device from the device library, and load it into a device editor, so the designer can modify one or more layers. If the designer does not know the name of a device in the device library, the designer draws all of the layers of the IC (e.g., using a stylus or pointing device). The EDA tool can extract the polygons from the user's drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A to 11I show nine layouts included in an example of the device form library of FIG. 1, in accordance with some embodiments.

DETAILED DESCRIPTION

Figure 1:
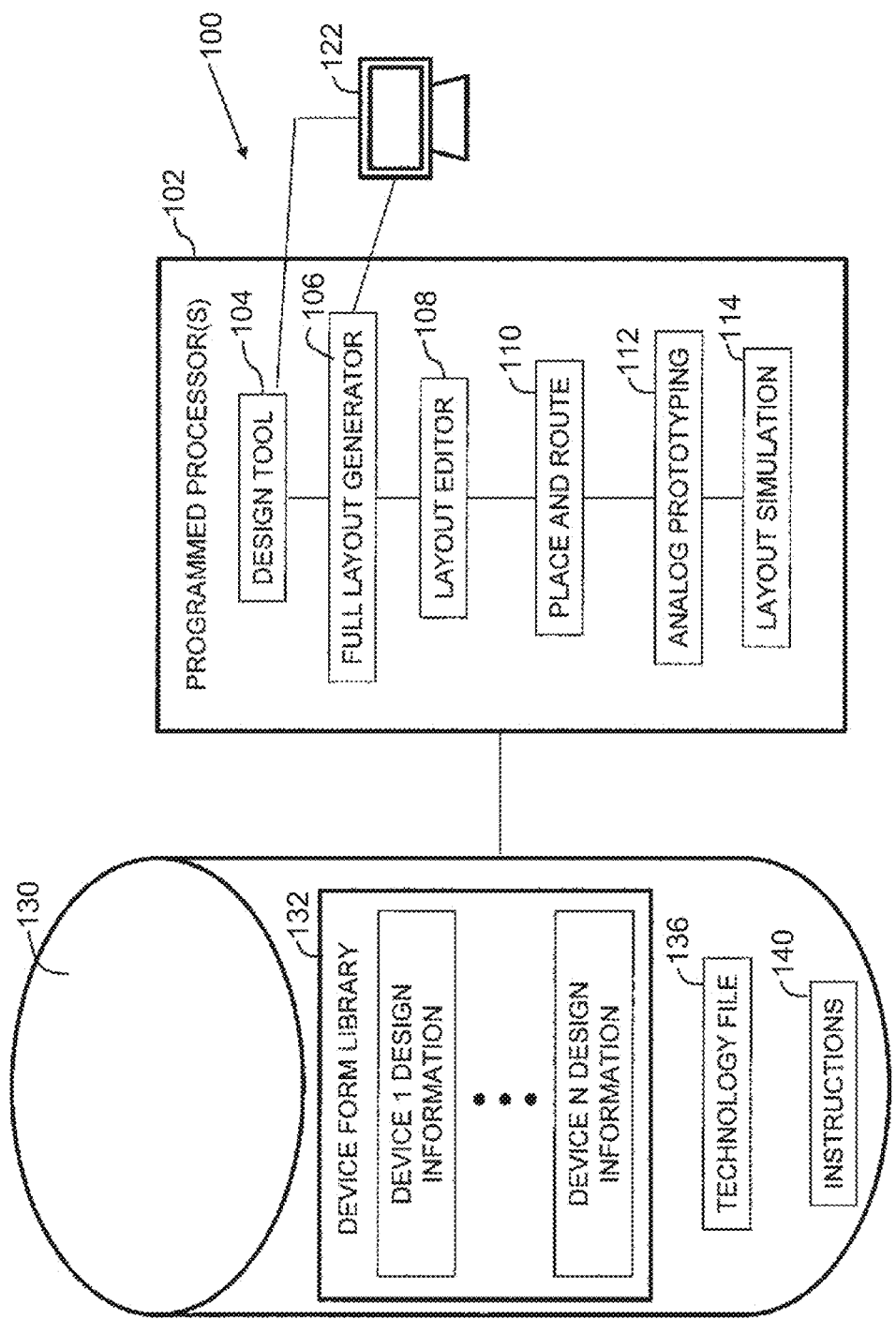
FIG. 1 is a block diagram of a system, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure describes embodiments of a method and system to simplify the designer's task of drawing device layers to retrieve a previously defined semiconductor device from a device form library, if the designer does not know the name of the device record in the device form library. The method and system can enable the designer to draw fewer layers (in some cases as few as one single layer, or a portion of one single layer) to identify and retrieve the full layout of a device for editing and modification.

The inventor has determined that in a device form library, many semiconductor device types will share a plurality of common layers, but many devices contain one or more "key layers," which are unique to that device type, or are shared by a small subset of the other devices in the device form library. An experienced designer may know the layout of one or more of the key layers of a device that the designer wishes to retrieve from the design form library. The methods and systems described in this disclosure enable the designer to draw one (or a few) key layer(s) of a device the designer wishes to retrieve from the device form library. The system applies one or more criteria to identify a small subset of the devices previously stored in the device form library. The designer can select one of the displayed devices, or continue to draw additional layers or portions of layers, to allow the system to reduce the number of devices displayed for selection.

FIG. 1 is a block diagram of a system 100 according to some embodiments. The system 100 comprises a non-transitory machine readable storage medium 130 storing data 132 representing a plurality of previously defined semiconductor devices, each having a respective plurality of layers. The medium 130 also stores a technology file 136 containing design parameters (e.g., critical dimension, minimum line spacing) which characterize the technology node for the device. The medium 130 further stores a plurality of computer program instructions 140 which are executed by a processor 100. The processor 102 can be a microcomputer, a mobile device, or an embedded processor. The computer program instructions configure the logic circuitry of the processor 102 to form a special purpose computer capable of performing EDA tool functions.

The processor 102 provides a design tool 104 suitable for design and editing individual semiconductor devices. A full layout generator 106 (described below) recognizes a layer or portion of a layer drawn by a designer, and identifies one or more devices in the device form library which have layers matching the drawing input by the designer. The layout editor 108 allows the designer to manually input interconnecting paths. A place and route engine 110 automatically generates the remaining interconnects which the designer has not manually input. An analog prototyping block 112 automates placement of analog devices and provides the designer information regarding the impact of a candidate analog device placement. A layout simulation tool 114 analyzes performance of candidate designs.

The programmed processor 102 is configured to receive an input from a device such as a computer 122, terminal, mobile device, or the like. The input data are indicative of a drawing of at least a portion of at least one layer of a semiconductor device, which the user inputs at the device 122. The processor 102 is configured to compare the at least one portion of the at least one layer to corresponding portions in corresponding layers of the plurality of previously defined semiconductor devices stored in the non-transitory machine readable storage medium 132.

The computer 102 is configured to apply a criterion for recognizing the layers that the designer draws, and identifying one or more candidate devices from the device form library that include the recognized layer(s). In some embodiments, the computer is configured to identify a name or ID number of a layer of one of the previously defined semiconductor devices that matches the layer indicated by the received input, and one or more devices that include that layer. In some embodiments, the user draws two layers, and the computer is configured to extract a relationship between the two layers, and identify one or more devices that include two layers with the same relationship.

Figure 2:
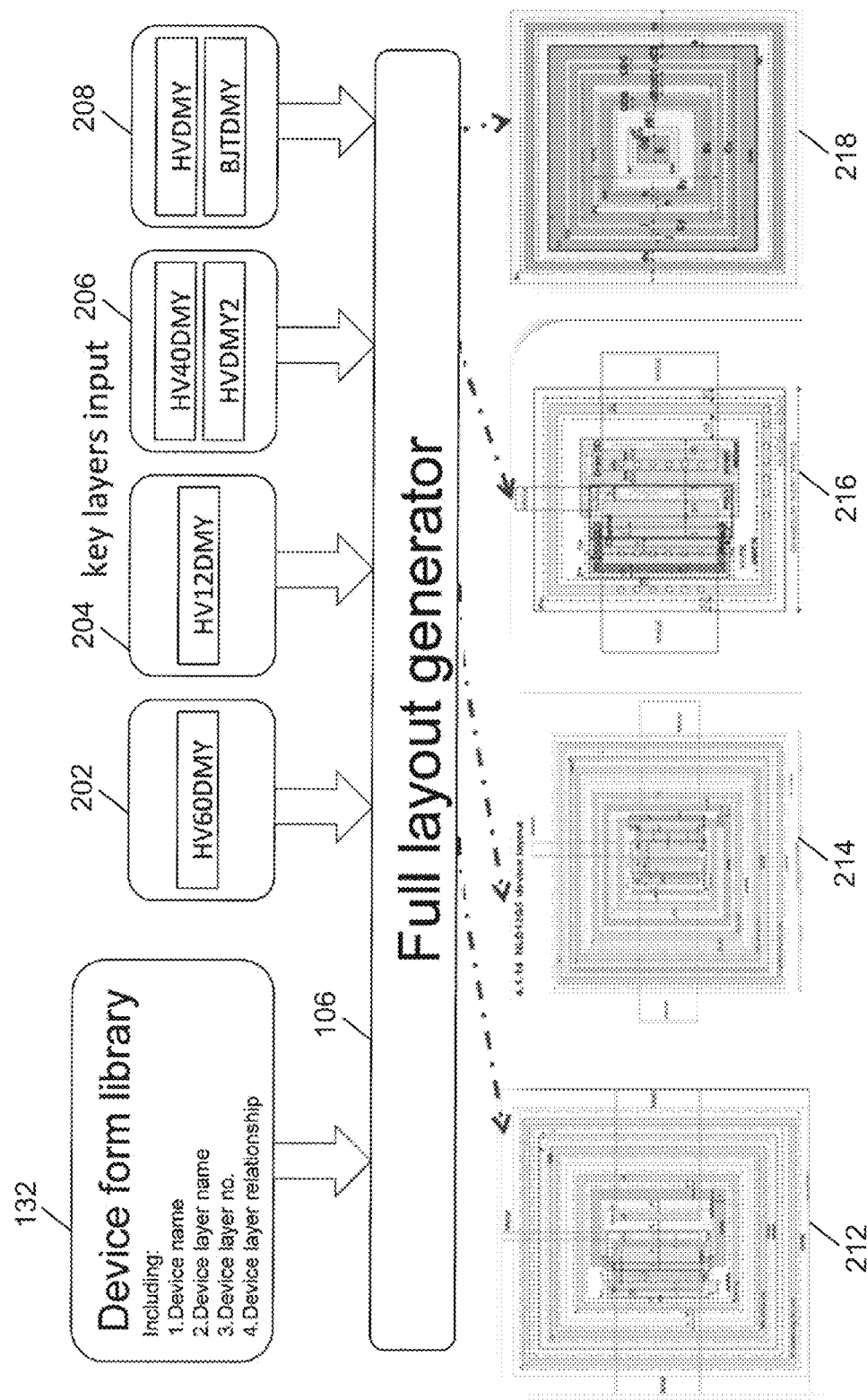
FIG. 2 is a schematic diagram of operation of the system of FIG. 1, in accordance with some embodiments.

FIG. 2 schematically shows the operation of the full layout generator 106, in accordance with some embodiments. The user inputs one or more drawings, each corresponding to a respective layer or portion of a layer of a device to be accesses from the device form library. In FIG. 2, the input drawings are represented by rectangles containing a device layer name. The full layout generator 106 is coupled to access the device form library 132. The device form library contains, for each device type, the following data: (1) device name, (2) device layer name, (3) device layer number, and (4) device layer relationships.

Figure 3:
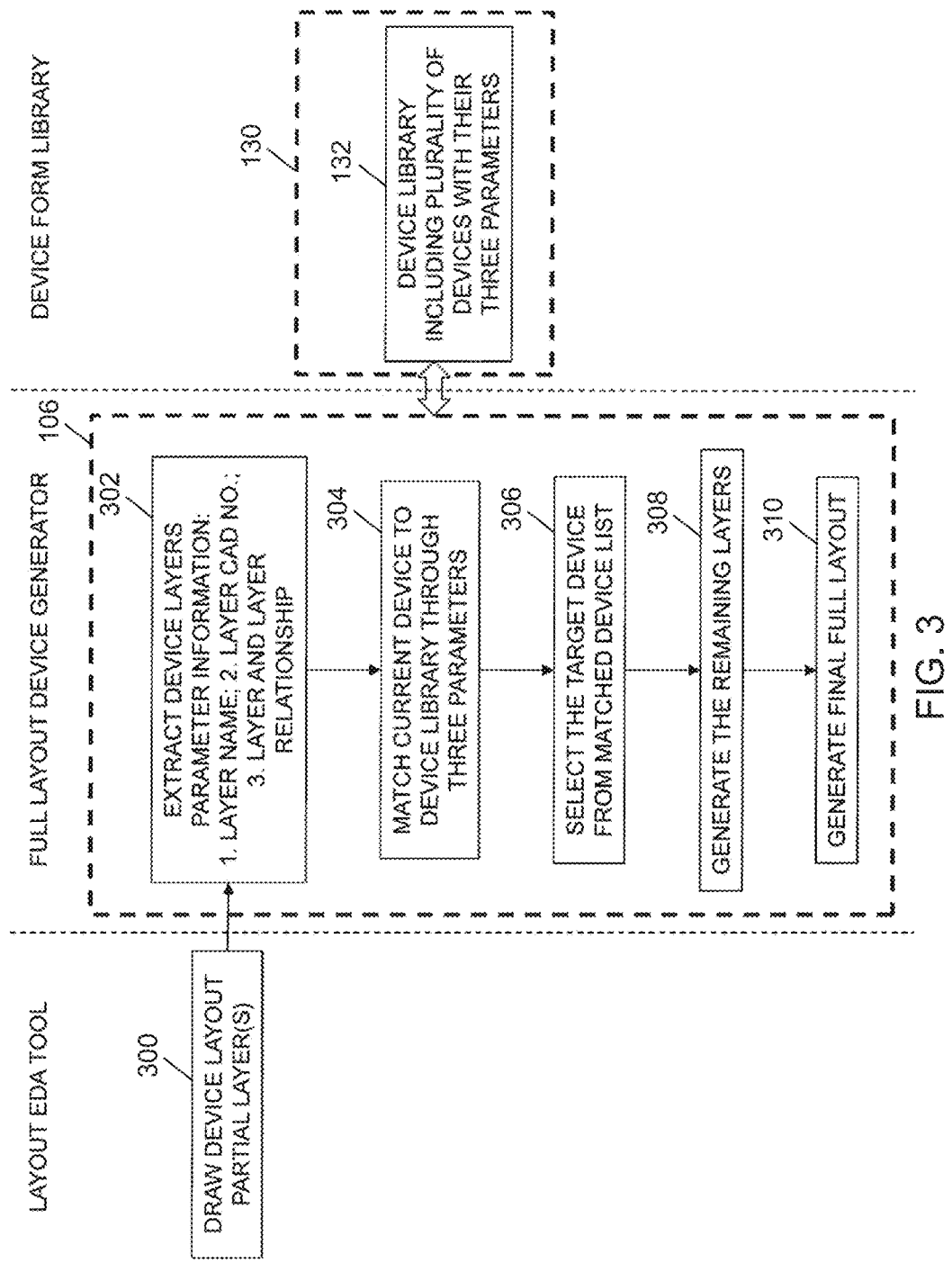
FIG. 3 is a schematic diagram of the full layout generator of FIG. 1, in accordance with some embodiments.

FIG. 3 schematically shows the interaction between the components of the system 100. Using the layout EDA tool 102, at block 300, the user draws a portion of a device layer comprising a layer or partial layer. The full layout device generator 106 performs several functions. In block 302, the full layout device generator 106 extracts device layers' parameter information, including: (A) layer name, (B) layer computer assisted design (CAD) No., layer and (C) layer relationship. At block 304, the processor 102 matches the currently desired device (for which the designer has drawn a layer) against corresponding data for the device form library using one of the parameters A to C as the matching criterion. The processor 102 causes displaying of all matching devices from the device form library 132 on the display of input device 122. At block 308, all of the remaining layers of each device to be displayed are automatically retrieved from the device form library and complete devices are generated. At block 310, a final full layout is generated and stored in the storage medium 130.

Figure 4:
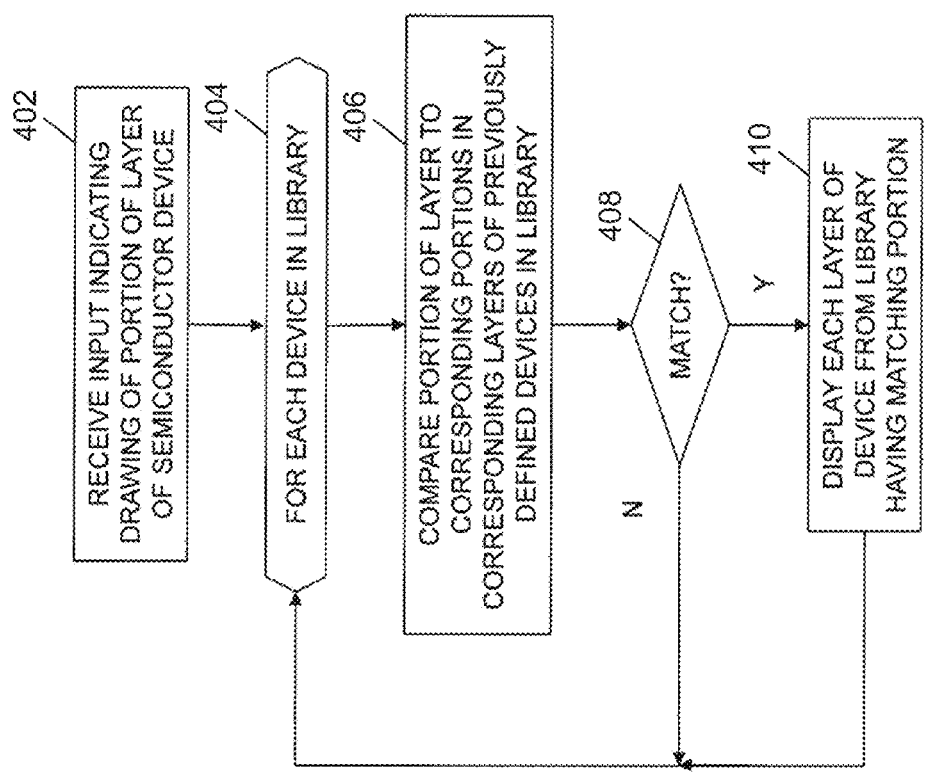
FIG. 4 is a flow chart of a method of using the system of FIG. 1, in accordance with some embodiments.

FIG. 4 is a flow chart of a method in accordance with some embodiments

At step 402, the computer processor 102 receives an input indicative of a drawing of at least a portion of at least one layer of a semiconductor device. The input can be a drawing of an impurity region, an electrode, an isolation region, a dummy pattern, or the like.

At step 404, a loop containing steps 406-410 is performed for each device in the device form library.

At step 406, the processor compares the at least one portion of the at least one layer to corresponding portions in corresponding layers of device form library 132 containing a plurality of previously defined devices stored in a non-transitory machine readable storage medium 130.

At step 408, the processor 102 automatically determines whether a corresponding layer of one of the devices in the device form library matches the portion of a layer input by the designer. The comparison can be a comparison between polygons. For example, the comparison can determine whether the device form library has a polygon that matches a polygon in the input layer. If there is a match, step 410 is performed. If there is no match, the loop returns to step 404.

At step 410, the processor 102 displays, on the display device of the input device 122, each layer of at least one of the plurality of previously defined devices for which the corresponding portion in the corresponding layer matches the at least one portion of the at least one layer of the semiconductor device. If more than one matching device is displayed, the user can select one of the displayed devices using a keyboard or pointing device, for example. The processor 102 receives a selection by a user of one of the displayed devices, and discontinues displaying any of the previously defined devices other than the selected device.

In some cases, an experienced designer knows exactly which unique key layer to input for the device he/she wishes to retrieve, and step 410 only displays a single device. The step 402 receives an input indicative of a drawing of only a single layer of the semiconductor device. In some cases, the step 402 receives an input indicative of a drawing of only a portion of only a single layer of the semiconductor device. The processor 102 is configured to receive an input indicative of a drawing of only a portion of a single layer of the semiconductor device, and perform the identifying based on the portion of the single layer.

Figure 5:
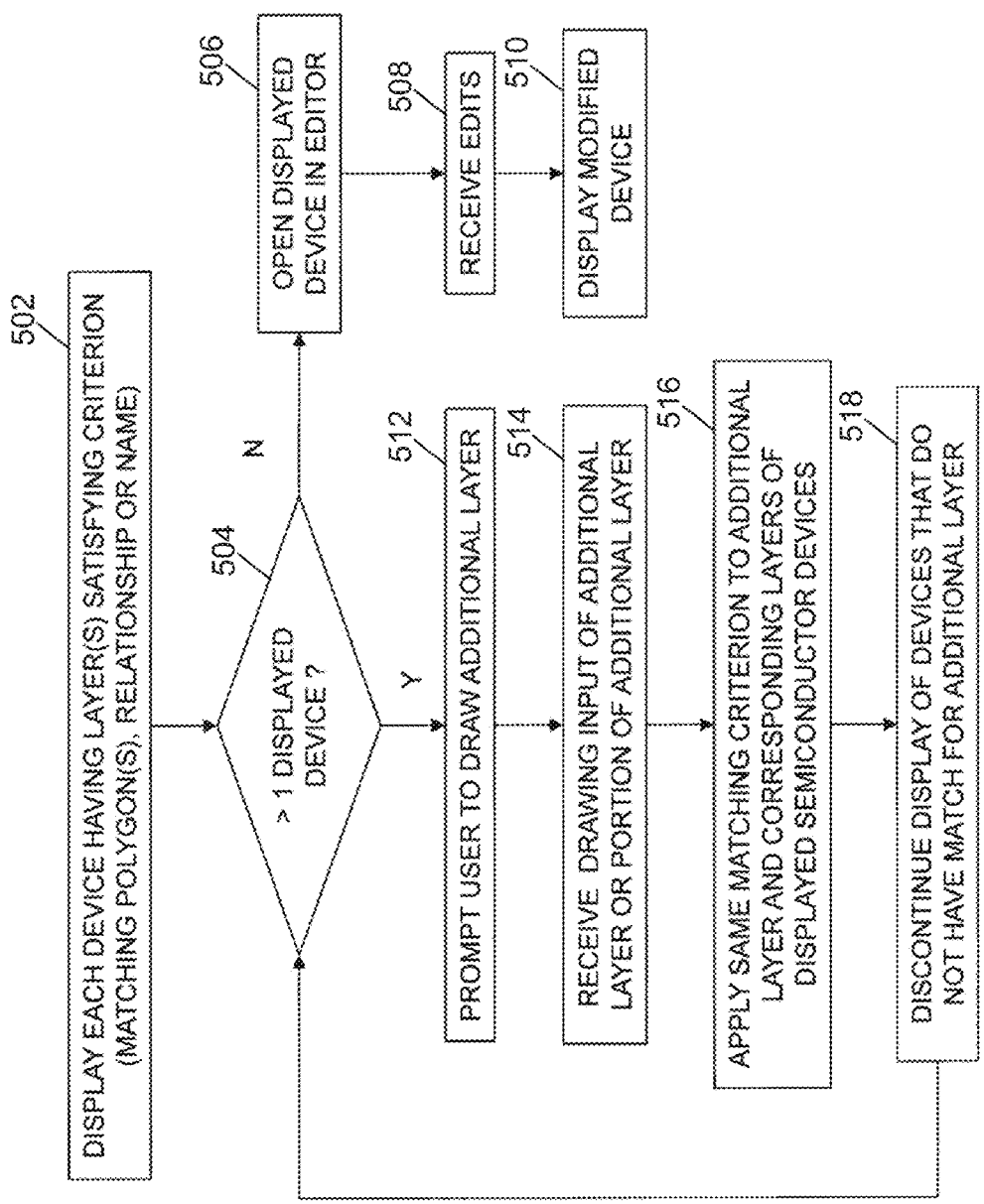
FIG. 5 is a flow chart of additional method steps for selecting one of a plurality of devices displayed in the method of FIG. 4, in accordance with some embodiments.

In other cases, the key layer input by the designer is shared by two or more devices, and the method continues as shown in FIG. 5.

FIG. 5 is a flow chart of a method of further narrowing a list of candidate devices from the device form library, if the system initially retrieves more than one device from the device form library. The method of claim 5 can be used for any of the matching criteria described with reference to FIGS. 4 and 6-9.

In step 502 of FIG. 5, the processor 102 causes the device 122 to display each layer satisfying the matching criterion. For example, the matching criterion of embodiments according to FIG. 4 is a match between polygons of the input layer and polygons in the corresponding layer of the device form library. In other embodiments (e.g., FIG. 7), the criterion is based on a relationship between successive layers. In other embodiments (e.g., FIG. 8), the criterion is based on layer name or CAD number.

At step 504, if more than one matching device is currently displayed, the loop from step 512 to step 518 is performed. If only a single device is displayed step 506 is performed.

At step 506, the displayed device is opened in the device editor.

At step 508, the user inputs edits or modifications to the device design.

At step 510, the system displays the modified device. The user can store the modified device in the non-transitory machine readable storage medium 130, or continue to modify the design.

At step 512, the system prompts the user to draw at least one additional layer or additional portion of a layer.

At step 514, the system receives a drawing input by the user for an additional layer or an additional portion (polygon) of a layer.

At step 516, the system applies the same matching criterion used for the first input layer to perform recognition of the second input layer. For example if a polygon-to-polygon match is performed for the first input layer (e.g., FIGS. 4 and 6), then a polygon-to-polygon match is performed for the second input layer. If a relationship match is performed for the first and second input layers (e.g., FIGS. 7, 8), then a relationship match is performed for a third and a fourth input layers. If a layer name/CAD number match is performed for the first input layer (e.g., FIG. 9), then a name/CAD number match is performed for the second input layer.

At step 518 of FIG. 5, the processor discontinues displaying of any of the previously displayed devices that do not result in a match at step 516.

For example, if the user inputs a drawing of a first key layer of a device, the system can display six devices which have matching key layers. If the user then inputs a drawing of a second key layer, the system can determine that only one device in the device form library 132 has key layers matching both the input key layers. The system can automatically eliminate other devices as candidates without further inputs from the designer.

Figure 6:
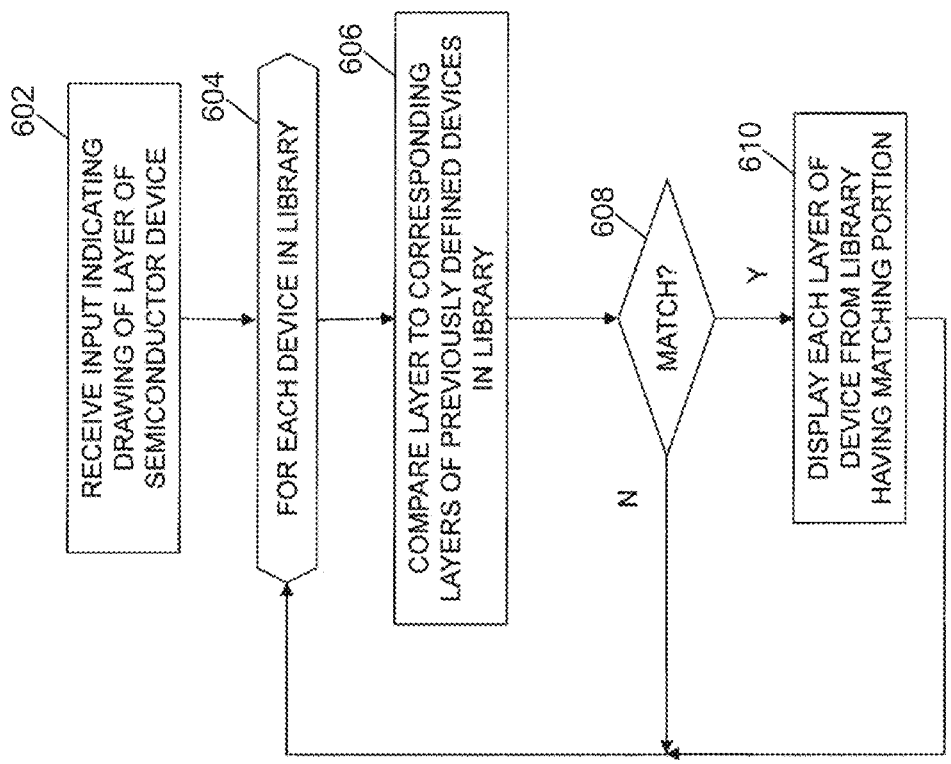
FIG. 6 is a flow chart of a variation of the method of FIG. 4, in accordance with some embodiments.

FIG. 6 is a flow chart of a variation of the method of FIG. 4.

At step 602, the computer processor 102 receives an input indicative of a drawing of a (whole) layer of a semiconductor device.

At step 604, a loop containing steps 606-610 is performed for each device in the device form library.

At step 606, the processor compares the whole layer to corresponding layers of the plurality of previously defined devices in the device form library 132 stored in a non-transitory machine readable storage medium 130.

At step 608, the processor 102 automatically determines whether a corresponding layer of one of the devices in the device form library matches the layer input by the designer. The comparison can be a comparison between all of the polygons in the input layer and corresponding patterns in a layer of a device in the device form library 132. If there is a match, step 610 is performed. If there is no match, the loop returns to step 604.

At step 610, the processor 102 displays, on the display device of the input device 122, each layer of at least one of the plurality of previously defined devices that matches the layer of the input device. If more than one matching device is displayed, the user can select one of the displayed devices using a keyboard or pointing device, for example.

Figure 7:
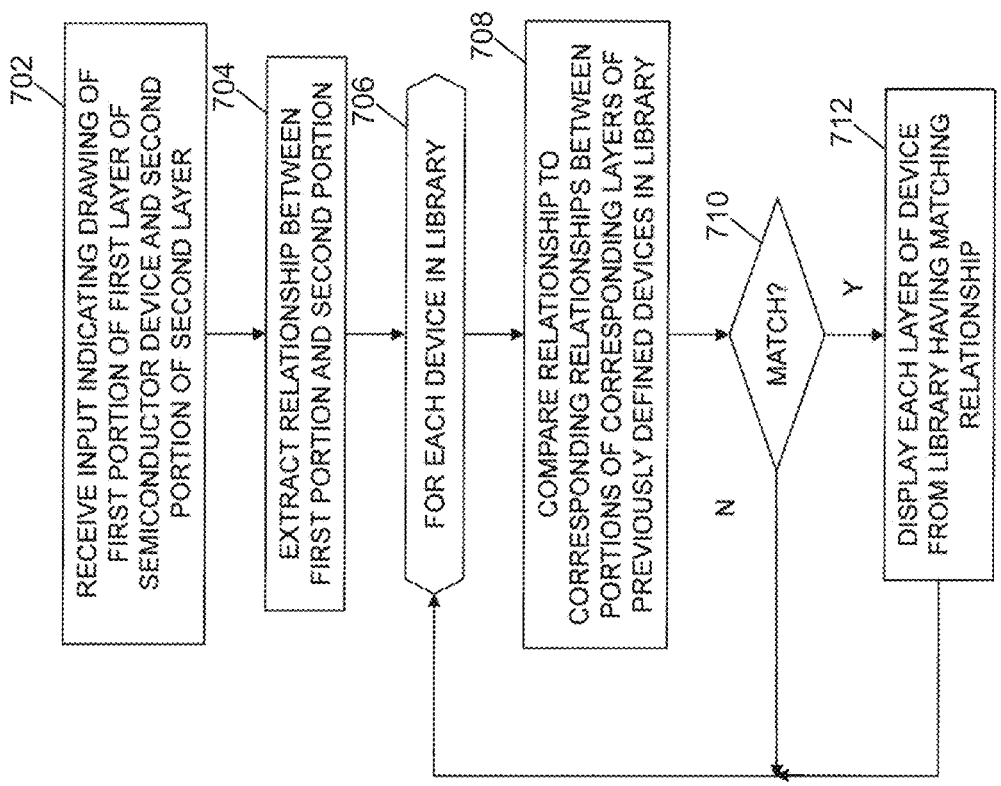
FIG. 7 is a flow chart of a variation of the method of FIG. 4, in accordance with some embodiments.

FIG. 7 is a flow chart of a variation of the method using a relationship matching criterion, in accordance with some embodiments. In this embodiment, the user inputs drawings of at least two layers, and the system 100 extracts a relationship between polygons in two or more layers.

At step 702, a computer 102 receives an input indicative of a drawing of at least a first polygon of a first layer of a semiconductor device and a drawing of at least a second polygon of a second layer of the semiconductor device.

At step 704, the computer extracts a relationship between the first polygon and the second polygon. Examples of relationship extraction are provided below, in the discussion of FIGS. 8, 10A and 10B.

At step 706, a loop including steps 708-712 is performed for each device in the device form library 132.

At step 708, the extracted relationship is compared to a corresponding relationship in a plurality of previously defined devices stored in a non-transitory, machine readable storage medium.

At step 710, the system determines whether a match is found. If there is a match, step 712 is performed. If there is no match, execution returns to step 706.

At step 712, each of the plurality of previously defined devices for which the corresponding relationship matches the extracted relationship is displayed. If multiple devices are displayed in step 712, then the method of FIG. 5 can be performed to input a drawing of one or more additional layers and automatically reduce the number of devices that are displayed. Alternatively, at any time, the user can manually select one of the displayed devices without drawing any more layers.

Figure 8:
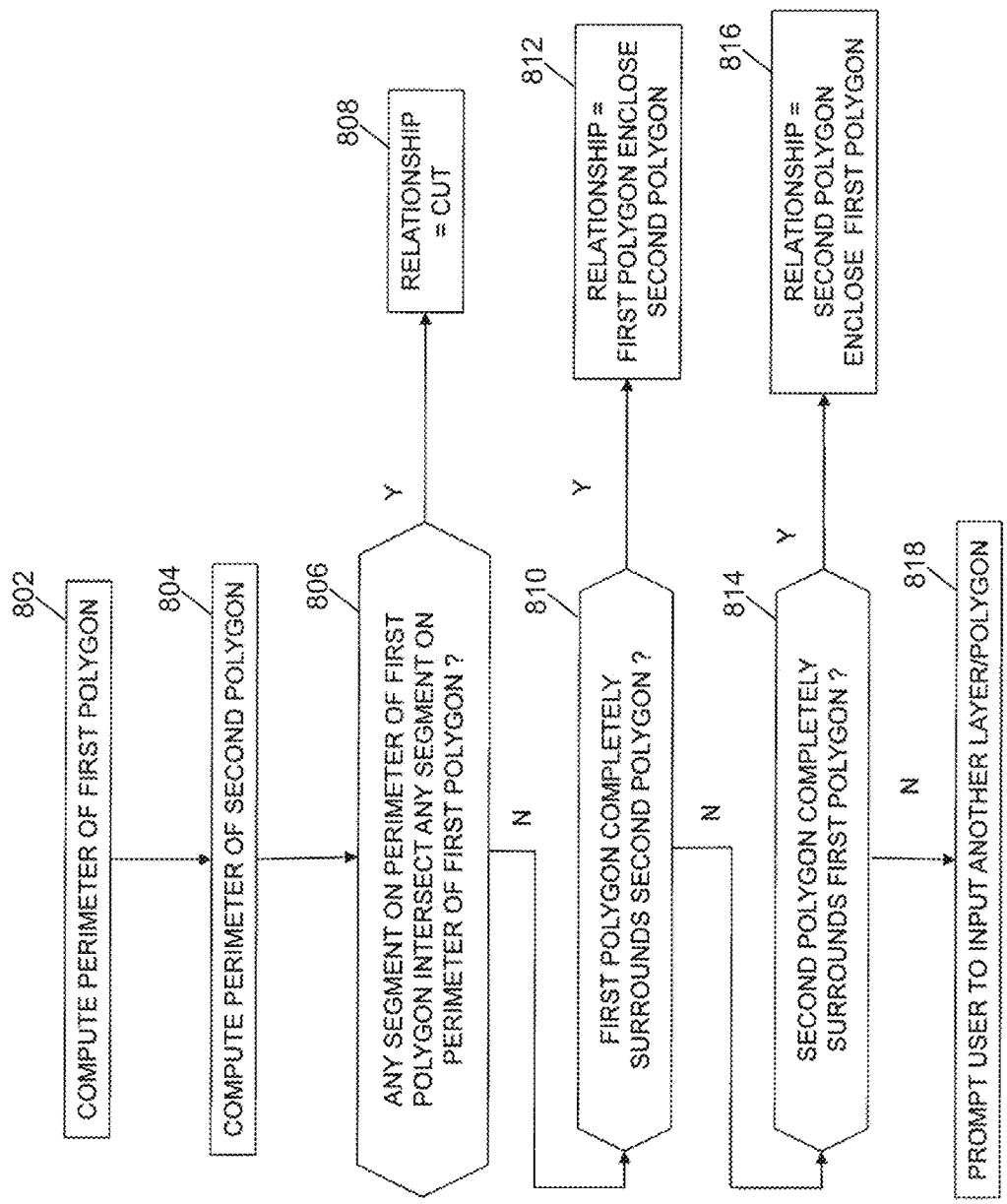
FIG. 8 is a flow chart of a method of performing the step of determining a relationship, as shown in FIG. 7, in accordance with some embodiments.

FIG. 8 is a flow chart of a method of extracting a relationship between layers. FIG. 8 is best understood by first referring to the examples of FIGS. 10A and 10B.

Figure 10B:
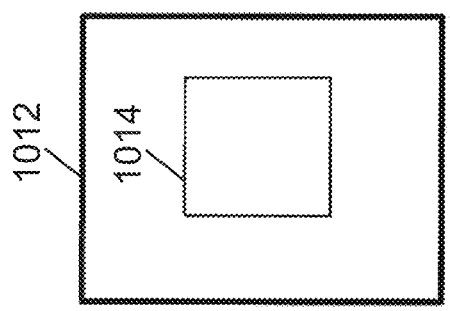
FIG. 10B show an example of the "enclose" relationship, in accordance with some embodiments.
Figure 10A:
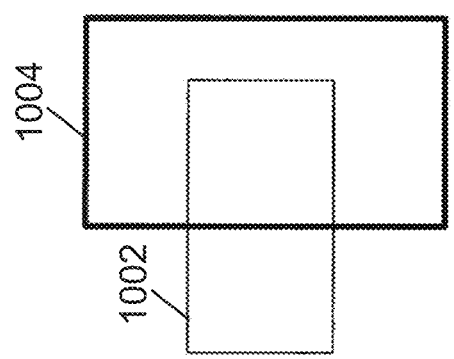
FIG. 10A shows an example of the "cut" relationship, in accordance with some embodiments.

FIG. 10A shows an example of a "cut" relationship. In FIG. 10A, a second polygon 1004 of a second layer is projected on a first polygon 1002 of a first layer in a two dimensional representation, as though both polygons were formed in the same layer. When viewed as a two-dimensional layout, the two polygons 1002, 1004 intersect. One of the lines on the perimeter of polygon 1004 crosses two of the lines on the perimeter of polygon 1002. The "cut" relationship can be detected automatically be computing the coordinates of the line segments on the perimeter of the polygons in each of the two layers. The line segments can be divided into horizontal and vertical lines. The end coordinates of each horizontal segment in the first layer can be compared to the end coordinates of each vertical segment in the second layer to determine whether any of those segments intersect. The end coordinates of each vertical segment in the first layer can be compared to the end coordinates of each horizontal segment in the second layer to determine whether any of those segments intersect. If a non-zero number of intersections is found, the relationship between the layers is referred to herein as a cut relationship.

FIG. 10B shows an example of an "enclose" relationship. The perimeter of the first polygon 1012 in the first layer completely surrounds the perimeter of the second polygon 1014 in the second layer. There is no intersection between any of the segments of the first polygon 1012 and any of the segments of the second polygon 1014. All segments of the second polygon 1014 are between the left segment of polygon 1012 and the right segment of polygon 1012. All segments of the second polygon 1014 are between the top segment of polygon 1012 and the bottom segment of polygon 1012. Such a relationship is referred to herein as an "enclose" relationship.

Referring again to FIG. 8, at step 802, the line segments of the perimeter of the first polygon are computed.

At step 804, the line segments of the perimeter of the second polygon are computed.

At step 806, the computer determines whether any segment of the perimeter of the first polygon intersects any segment of the perimeter of the second polygon. If there is at least one intersection, then at step 808, the relationship is identified as a cut relationship. If there are no intersections, step 810 is performed.

At step 810, the computer determines whether a perimeter of the first polygon completely surrounds a perimeter of the second polygon. If the perimeter of the first polygon completely surrounds the perimeter of the second polygon, then step 812 identifies the relationship as "<first-polygon> cut <second polygon>". If the perimeter of the first polygon does not completely surround the perimeter of the second polygon, then step 814 is performed next.

At step 814, the computer determines whether a perimeter of the second polygon completely surrounds a perimeter of the first polygon. If the perimeter of the second polygon completely surrounds the perimeter of the first polygon, then step 816 identifies the relationship as "<second-polygon> cut <first polygon>". If the perimeter of the second polygon does not completely surround the perimeter of the first polygon, then step 818 is performed next.

At step 818, the system prompts the user to draw another layer or polygon, so that the full layout generator 106 can extract additional relationships from the additional layer/polygon and perform additional matching.

Figure 9:
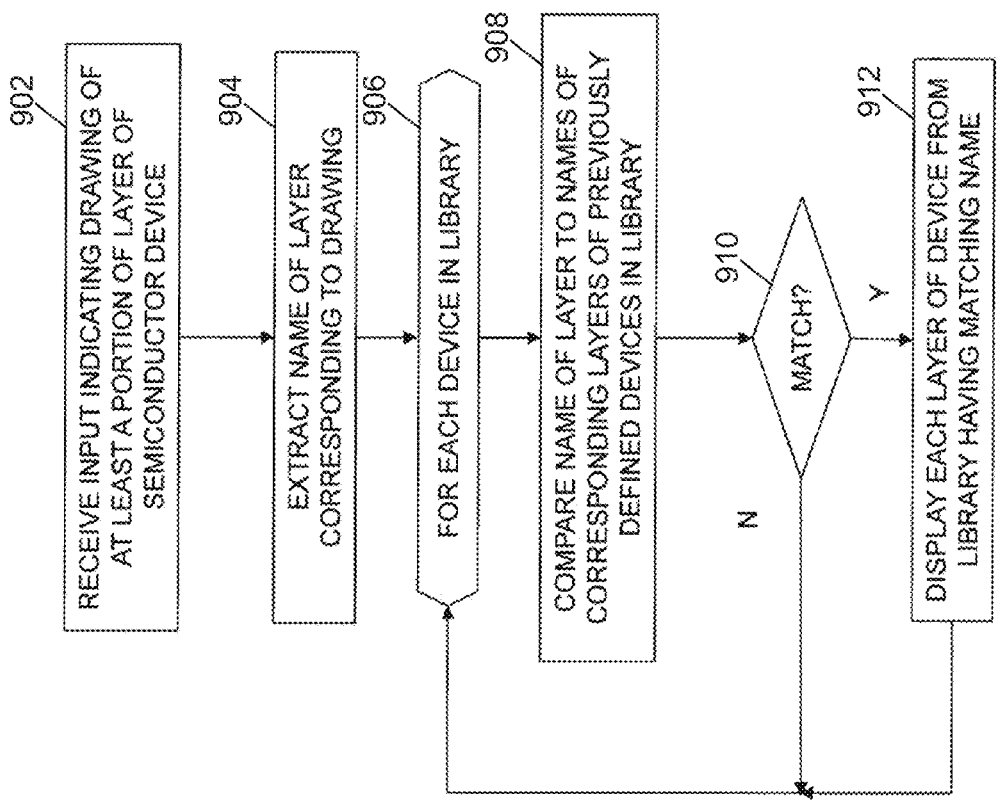
FIG. 9 is a flow chart of a variation of the method of FIG. 4, in accordance with some embodiments.

FIG. 9 is a flow chart of another variation of the method using name matching or CAD number matching, in accordance with some embodiments.

At step 902, a computer 102 receives an input indicative of a drawing of at least a first polygon of a first layer of a semiconductor device.

At step 904, the system 100 extracts a layer name or CAD number of the input layer, by comparing the input polygons to the polygons of the layers stored in the device form library 132. For example, in some embodiments, the layer name and number can be determined by comparing the layer to layers of each device in the device form library 132 until a matching layer is found. Upon identifying the first matching layer, the layer name extraction is completed.

In other embodiments, a separate layer name list (not shown) includes the superset (union) of all of the polygons, and the corresponding layer names of layers containing those polygons; the input polygon is matched against the layer name list. When a matching polygon(s) is found, the layer name(s) or CAD number(s) corresponding to the matching polygon(s) is determined.

At step 906, a loop including steps 908-912 is performed for each device in the device form library 132.

At step 908, the extracted layer name/CAD number is compared to a corresponding layer name or CAD number in a plurality of previously defined devices stored in a non-transitory, machine readable storage medium 130.

At step 910, the system determines whether a match is found. If there is a match, step 912 is performed. If there is no match, execution returns to step 906.

At step 912, each of the plurality of previously defined devices for which the corresponding layer name or CAD number matches the extracted layer name or CAD number is displayed. If multiple devices are displayed in step 912, then the method of FIG. 5 can be performed to input a drawing of one or more additional layers and automatically reduce the number of devices that are displayed. Alternatively, at any time, the user can manually select one of the displayed devices without drawing any more layers.

FIGS. 11-14 contain examples of application of the above methods.

FIGS. 11A to 11I show nine different device layouts, referred to below as devices 1 to 9, respectively. Each device layout has five or more of a plurality of polygons A-F, X-Z. For ease of understanding, in the examples of FIGS. 11A-11I, each layer only has one polygon; in other examples, each layer can have any number of polygons. Each of the FIGS. 11A-11I represents the projection of the polygons from five or more layers into a two-dimensional representation.

Table 1 shows an example of the information stored in the device form library 132, in addition to the description of the polygons in each layer. For example, in the first row the device having the name "device-1" (FIG. 11A) includes polygon A in layer 1, polygon C in layer 3, polygon D in layer 4, polygon E in layer 5, and polygon F in layer 6. The following relationships are extracted from the polygons A, C-F and stored in the device form library: A cut C, A cut D, C cut D, D enclose E, D enclose F, E enclose F. This means that polygon A intersects polygons C and D, polygon D encloses polygons E and F, and polygon E encloses polygon F.

TABLE 1

| Device-Name | Layer Name & CAD No. | Layer & Layer relationship |
|---|---|---|
| Device-1 (FIG. 11A) | A 1;0, C 3;0, D 4;0, E 5;0, F 6;0 | A cut C, A cut D, C cut D, D enclose E, D enclose F, E enclose F |
| Device-2 (FIG. 11B) | A 1;0, B 2;0, C 3;0, D 4;0, F 6;0 | A cut C, A cut D, B cut C, B cut D, B enclose A, C cut D, D enclose F |
| Device-3 (FIG. 11C) | A 1;0, G 7;0, C 3;0, D 4;0, E 5;0, F 6;0 | A cut C, A cut D, G cut C, G cut D, G enclose A, C cut D, D enclose E, D enclose F, E enclose F |
| Device-4 (FIG. 11D) | A 1;0, B 2;0, C 3;0, D 4;0, E 5;0, F 6;0 | A cut B, A cut C, A cut D, B cut C, C cut D, D enclose E, D enclose F, E enclose F |
| Device-5 (FIG. 11E) | A 1;0, B 2;0, C 3;0, D 4;0, E 5;0, F 6;0 | A cut C, A cut D, B cut C, B cut D, B enclose A, C cut D, D enclose E, D enclose F, E enclose F |
| Device-6 (FIG. 11F) | A 1;0, B 2;0, C 3;0, D 4;0, E 5;0, F 6;0 | A cut C, A cut D, B cut C, B cut D, B enclose A, C cut D, D enclose E, D enclose F, E cut F |
| Device-7 (FIG. 11G) | A 1;0, B 2;0, C 3;0, D 4;0, E 5;0, X 8;0 | A cut C, A cut D, B cut C, B cut D, B enclose A, C cut D, D enclose E, X enclose A, X enclose B, X enclose C, X enclose D, X enclose E |

TABLE 1-continued

| Device-Name | Layer Name & CAD No. | Layer & Layer relationship |
|---|---|---|
| Device-8 (FIG. 11H) | A 1;0, B 2;0, C 3;0, D 4;0, E 5;0, F 6;0, Y 9;0 | A cut C, A cut D, B cut C, B cut D, B enclose A, C cut D, D enclose E, D enclose F, E enclose F, Y enclose A, Y enclose B, Y enclose C, Y enclose D, Y enclose E, Y enclose F |
| Device-9 (FIG. 11I) | A 1;0, B 2;0, C 3;0, D 4;0, E 5;0, F 6;0, Z 10;0 | A cut C, A cut D, B cut C, B cut D, B enclose A, C cut D, D enclose E, D enclose F, E enclose F, Z enclose A, Z enclose B, Z enclose C, Z enclose D, Z enclose E, Z enclose F |

Figure 12:
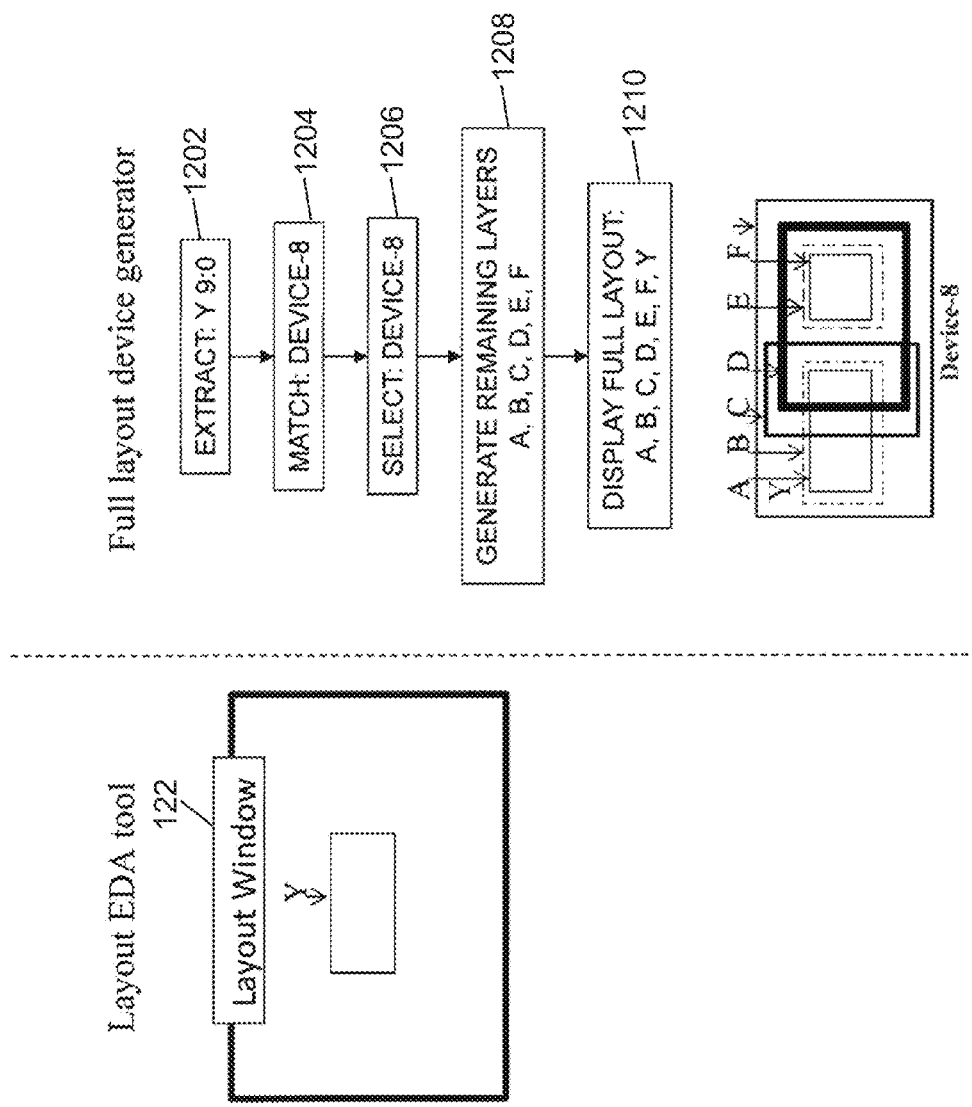
FIG. 12 shows an example of an operation flow for selecting and displaying a device, in accordance with some embodiments.

FIG. 12 is an example of an embodiment in which the system 100 identifies matching devices by comparing a layer drawn in the layout window of the input device 122 against the layer name and CAD number of the devices in FIGS. 11A-11I (as described in Table 1).

At step 1202, the full layout generator 106 extracts the polygon in the layout window 122 and determines the device geometry, which in this case corresponds to the layer Y, which has a CAD number of 9:0.

At step 1204, the full layout generator 106 matches the layer name Y and/or the CAD number 9:0 against the layer names for each device in the device form library 132. Only device 8 (FIG. 11H) has a matching layer.

At step 1206, the full layout generator generates all of the remaining layers for the device 8 (FIG. 11H).

At step 1208, the full layout of device 8 is displayed, as shown. Note that in this example, the designer knows the key layer of the device he/she wishes to edit, and can access the device by drawing a polygon of a single key layer uniquely identifying a single device in the device form library, without a need to know the name of the device, the name of the key layer, or the CAD number of the key layer.

Figure 13:
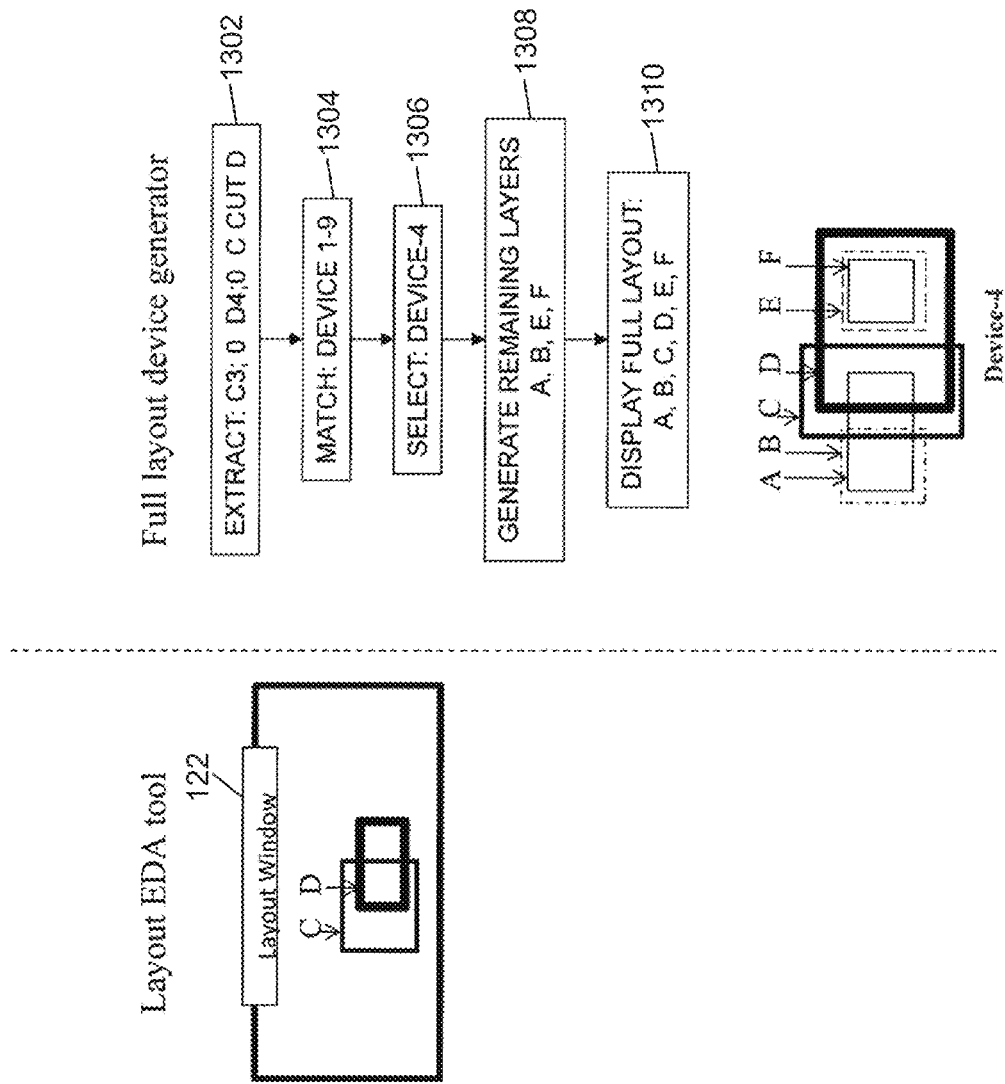
FIG. 13 shows an example of an operation flow for selecting and displaying a device, in accordance with some embodiments.

FIG. 13 is an example of an embodiment in which the system 100 identifies matching devices by comparing the relationship between two layers drawn in the layout window of the input device 122 against the relationships between two corresponding layers of the devices in FIGS. 11A-11I (as described in Table 1).

At step 1302, the full layout generator 106 extracts the polygons C and D in the layout window 122 and determines the device geometry, and the relationship between these polygons, which in this case is C cut D, because a segment of the perimeter of polygon C intersects two of the sides of the polygon D.

At step 1304, the full layout generator 106 matches the relationship C cut D against the relationships for each device in the device form library 132. All of the devices 1-9 (FIGS. 11A-11I) have the relationship C cut D. Thus, all of the devices 1-9 (FIGS. 11A-11I) are displayed.

At step 1306, the user manually selects device number 4 (FIG. 11D).

At step 1308, the full layout generator generates all of the remaining layers for the device 4 (FIG. 11D).

At step 1310, the full layout of device 4 is displayed, as shown.

Figure 14:
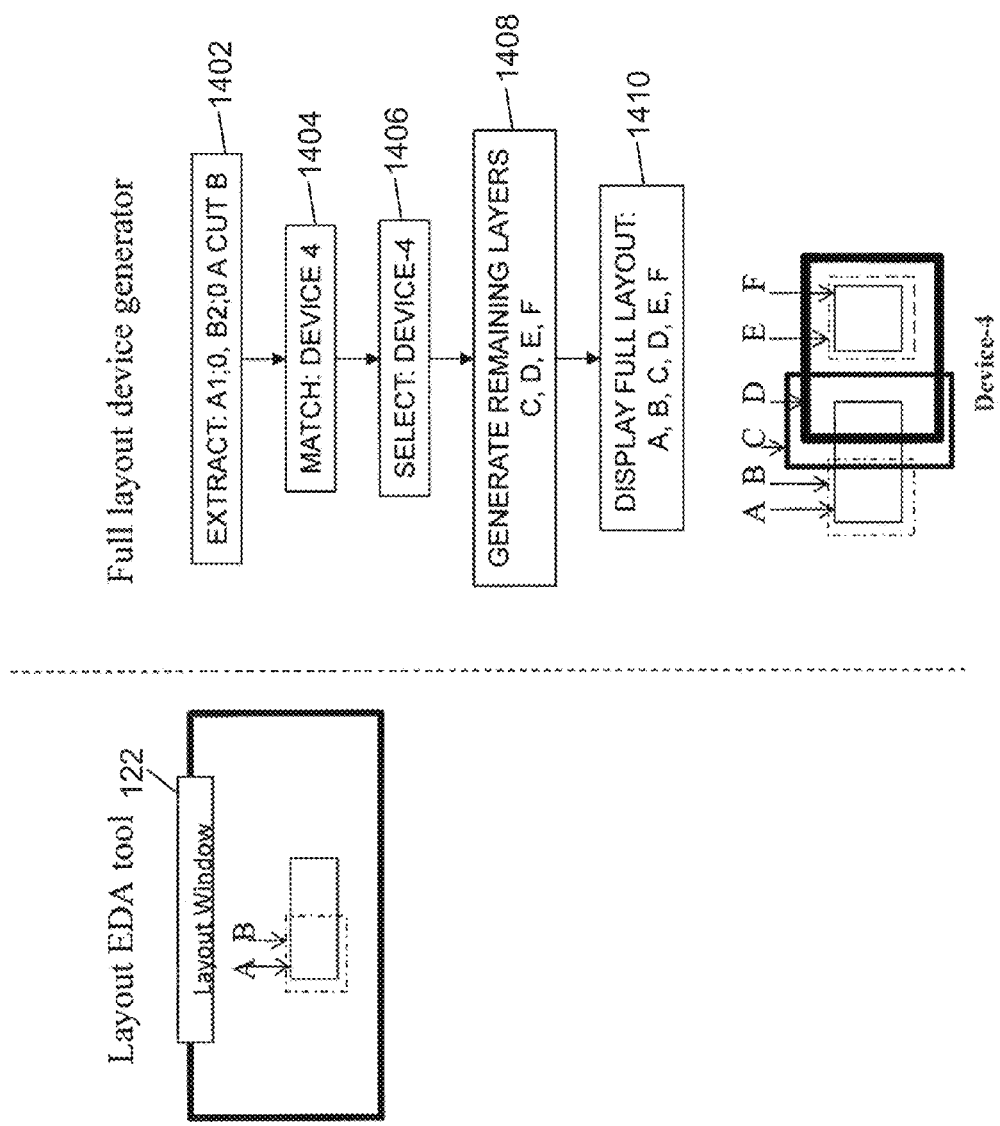
FIG. 14 shows an example of an operation flow for selecting and displaying a device, in accordance with some embodiments.

FIG. 14 is another example of an embodiment in which the system 100 identifies matching devices by comparing the relationship between two layers drawn in the layout window of the input device 122 against the relationships between two corresponding layers of the devices in FIGS. 11A-11I (as described in Table 1).

At step 1402, the full layout generator 106 extracts the polygons A and B in the layout window 122 and determines the device geometry, and the relationship between these polygons, which in this case is A cut B, because a segment of the perimeter of polygon A intersects two of the sides of the polygon B.

At step 1404, the full layout generator 106 matches the relationship A cut B against the relationships for each device in the device form library 132. Only the device 4 (FIG. 11D) has the relationship A cut B. Thus, only device 4 (FIG. 11D) is displayed.

At step 1406, the user manually selects device number 4 (FIG. 11D).

At step 1408, the full layout generator generates all of the remaining layers for the device 4 (FIG. 11D).

At step 1410, the full layout of device 4 is displayed, as shown.

The system and methods described herein allow a user to retrieve a device from a device form library by drawing one or more layers of the desired device in a layout window of an EDA tool. The user does not need to know the device name, layer name or layer CAD number. A user who knows a unique key layer can draw just that key layer (or a portion of that key layer) to access the device. A user who does not know a unique key layers can draw one or more layers. As the user draws each additional layer, the system continues to reduce the candidate set of devices displayed to the user; the user can select from among these displayed devices at any time.

In some embodiments, a method comprises receiving, in a computer, an input indicative of a drawing of at least a portion of at least one layer of a semiconductor device; comparing the at least one portion of the at least one layer to corresponding portions in corresponding layers of a plurality of previously defined devices stored in a non-transitory machine readable storage medium; and displaying, on a display device, each layer of at least one of the plurality of previously defined devices for which the corresponding portion in the corresponding layer matches the at least one portion of the at least one layer of the semiconductor device.

In some embodiments, a non-transitory, machine readable storage medium, encoded with computer program code, such that when the computer program code is executed by a processor, the processor performs a method. The method comprises receiving, in a computer, an input indicative of a drawing of at least a first polygon of a first layer of a semiconductor device and a drawing of at least a second polygon of a second layer of the semiconductor device; extracting a relationship between the first polygon and the second polygon, comparing the extracted relationship to a corresponding relationship in a plurality of previously defined devices stored in a non-transitory, machine readable storage medium; and displaying each of the plurality of previously defined devices for which the corresponding relationship matches the extracted relationship.

In some embodiments, a system comprises a non-transitory machine readable storage medium storing data representing a plurality of previously defined semiconductor devices, each having a respective plurality of layers; and a programmed processor. The processor is configured to: receive an input indicative of a drawing of at least a portion of at least one layer of a semiconductor device; compare the at least one portion of the at least one layer to corresponding portions in corresponding layers of the plurality of previously defined semiconductor devices stored in a non-transitory machine readable storage medium; identify a name of a layer of one of the previously defined semiconductor devices that matches the layer indicated by the received input; and display on a display device, each layer of at least one of the plurality of previously defined semiconductor devices for which the corresponding layer has a name that matches the identified name.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving, in an electronic design automation (EDA) tool for designing devices, an input drawing drawn by a user of at least a portion of at least one layer of a semiconductor device using a stylus or pointing device, wherein the user draws the drawing to input the portion of the at least one layer to the EDA tool;
   comparing, by the EDA tool, the at least one portion of the at least one layer to corresponding portions in corresponding layers of a plurality of previously defined devices having respectively different device designs and stored in a non-transitory machine readable storage medium, and determining which of the plurality of previously defined devices have corresponding portions for which designs thereof match the at least one portion drawn by the user; and
   displaying, on a display device, each layer of at least one of the plurality of previously defined devices for which a corresponding design of the portion in the corresponding layer matches the at least one portion of the at least one layer of the semiconductor device drawn by the user.

2. The method of claim 1, wherein the step of displaying displays each layer of each of the plurality of previously defined devices for which the corresponding portion in the corresponding layer matches the at least one portion of the at least one layer of the semiconductor device.

3. The method of claim 1, wherein the at least one layer comprises a first layer having a first polygon and a second layer having a second polygon, the method further comprising:
   extracting a relationship between the first polygon and the second polygon, and
   comparing the extracted relationship to a corresponding relationship in the plurality of previously defined devices,
   wherein the displaying step displays each of the plurality of previously defined devices for which the corresponding relationship matches the extracted relationship.

4. The method of claim 3, wherein the step of extracting a relationship includes determining whether a perimeter of the first polygon intersects a perimeter of the second polygon.

5. The method of claim 3, wherein the step of extracting a relationship includes determining whether a perimeter of the first polygon completely surrounds a perimeter of the second polygon.

6. The method of claim 1, further comprising:
   extracting a name of the at least one layer;
   comparing the extracted name to a corresponding name of a corresponding layer in the plurality of previously defined devices; and
   wherein the displaying step displays each of the plurality of previously defined devices for which the corresponding name matches the extracted name.

7. The method of claim 1, further comprising:
   receiving a selection by a user of one of the displayed devices, and
   discontinuing displaying any of the previously defined devices other than the selected device.

8. The method of claim 7, further comprising:
   receiving an input by the user modifying one off the layers of the selected device; and
   displaying the modified layer and the remaining layers of the selected device.

9. The method of claim 1, wherein the step of receiving receives an input indicative of a drawing of only a single layer of the semiconductor device.

10. The method of claim 1, wherein the step of receiving receives an input indicative of a drawing of only a portion of only a single layer of the semiconductor device.

11. A non-transitory, machine readable storage medium, encoded with computer program code, such that when the computer program code is executed by a processor, the processor performs a method comprising:
   receiving, in an electronic design automation (EDA) tool for designing devices, an input drawing drawn by a user of at least a first polygon of a first physical layer of a semiconductor device and a drawing drawn by the user of at least a second polygon of a second physical layer of the semiconductor device, wherein the user draws the drawings of the first and second polygons using a stylus or pointing device to input the first polygon of the first physical layer and the second polygon of the second physical layer to the EDA tool;

extracting a relationship between the first polygon and the second polygon, wherein extracting the relationship includes one of the group consisting of:

determining whether a perimeter of the first polygon intersects a perimeter of the second polygon, or determining whether a perimeter of the first polygon completely surrounds a perimeter of the second polygon;

comparing, by the EDA tool, the extracted relationship to a corresponding relationship in a plurality of previously defined devices having respectively different device designs and stored in a non-transitory, machine readable storage medium; and displaying each of the plurality of previously defined devices having respective layers for which the corresponding relationship matches the extracted relationship.

12. The non-transitory, machine readable storage medium of claim 11, wherein the step of extracting a relationship includes determining whether a perimeter of the first polygon intersects a perimeter of the second polygon.

13. The non-transitory, machine readable storage medium of claim 11, wherein the step of extracting a relationship includes determining whether a perimeter of the first polygon completely surrounds a perimeter of the second polygon.

14. The non-transitory, machine readable storage medium of claim 11, wherein the method further comprises:

receiving a selection by a user of one of the displayed devices, and discontinuing displaying any of the previously defined devices other than the selected device.

15. The non-transitory, machine readable storage medium of claim 14, wherein the method further comprises:

receiving an input by the user modifying one of the layers of the selected device; and displaying the modified layer and the remaining layers of the selected device.

16. A system, comprising:

a non-transitory machine readable storage medium storing data representing a plurality of previously defined semiconductor devices, each having a respective plurality of physical layers; and an electronic design automation (EDA) tool for designing devices, the EDA tool configured to:

receive an input drawing drawn by a user of at least a portion of at least one physical layer of a semiconductor device using a stylus or pointing device, wherein the user draws the drawing to input the portion of the at least one physical layer to the EDA tool;

compare the at least one portion of the at least one physical layer to corresponding portions in corresponding physical layers of the plurality of previously defined semiconductor devices having respectively different device designs and stored in a non-transitory machine readable storage medium;

identify a name of a physical layer of one of the previously defined semiconductor devices that matches the physical layer drawn by the user;

identify each of the plurality of previously defined semiconductor devices having a corresponding physical layer with a name that matches the identified name; and display on a display device, each layer of at least one of the identified previously defined semiconductor devices for which the corresponding physical layer has a name that matches the identified name.

17. The system of claim 16, wherein the processor is configured to receive an input indicative of a drawing of only a portion of a single physical layer of the semiconductor device, and perform the identifying based on the portion of the single physical layer.

18. The system of claim 16, wherein the processor is configured to display on the display device each layer of each one of the previously defined semiconductor devices for which the corresponding physical layer has a name that matches the identified name.

19. The system of claim 16, wherein the processor is further configured to:

receive a selection by a user of one of the displayed devices, and discontinue displaying any of the previously defined devices other than the selected device.

20. The system of claim 16, wherein the processor is further configured to:

receive an input by the user modifying one off the physical layers of the selected device; and display the modified physical layer and the remaining physical layers of the selected device.

* * * * *